United States Patent [19]

Frommer et al.

[11] Patent Number: 5,768,110
[45] Date of Patent: Jun. 16, 1998

[54] PLUG-IN CARD FOR ELECTRONIC DATA PROCESSING EQUIPMENT AND A PROCESS FOR ITS MANUFACTURE AND ASSEMBLY

[75] Inventors: Juergen Frommer, Fellbach; Manfred Illg, Weinstadt; Roland Etzkorn, Kernen; Michael Duane Baginy, Weinstadt, all of Germany

[73] Assignee: ITT Cannon GmbH, Weinstadt, Germany

[21] Appl. No.: 545,750

[22] PCT Filed: Feb. 25, 1995

[86] PCT No.: PCT/EP95/00691

§ 371 Date: May 28, 1996

§ 102(e) Date: May 28, 1996

[87] PCT Pub. No.: WO95/24020

PCT Pub. Date: Sep. 8, 1995

[30] Foreign Application Priority Data

Mar. 1, 1994 [DE] Germany ............... 44 06 644.9

[51] Int. Cl.$^6$ ............................................. H05K 5/00
[52] U.S. Cl. ............... 361/755; 361/737; 361/752; 361/800; 361/816; 361/747; 174/35 R; 174/35 GC; 439/76.1
[58] Field of Search ............ 361/737, 740, 361/747, 752, 755, 759, 799, 800, 803, 816, 818, 212; 235/492; 364/708.1; 439/76.1; 174/35 R, 35 GC, 51; 29/830

[56] References Cited

U.S. PATENT DOCUMENTS

| | | | |
|---|---|---|---|
| 5,242,310 | 9/1993 | Leung | 439/76.1 |
| 5,330,360 | 7/1994 | Marsh et al. | 439/76.1 |
| 5,339,222 | 8/1994 | Simmons et al. | 361/818 |
| 5,386,340 | 1/1995 | Kurz | 361/737 |
| 5,414,253 | 5/1995 | Baudouin et al. | 235/492 |
| 5,470,237 | 11/1995 | Byczek et al. | 439/76.1 |
| 5,477,426 | 12/1995 | Bethurum | 361/737 |
| 5,505,628 | 4/1996 | Ramey et al. | 439/76.1 |

FOREIGN PATENT DOCUMENTS

| | | |
|---|---|---|
| 584728 A2 | 8/1993 | European Pat. Off. |
| 9217265 U | 12/1992 | Germany. |
| 91/18451 | 11/1991 | WIPO. |
| 94/14306 | 6/1994 | WIPO. |

*Primary Examiner*—Leo P. Picard
*Assistant Examiner*—Anthony Dinkins
*Attorney, Agent, or Firm*—Freilich Hornbaker Rosen

[57] ABSTRACT

A plug-in card (10) for electronic data processing equipment in approximately longitudinal, rectangular, flat form has a housing (11), at lent one printed circuit board (16) and at least one edge connector (17, 18) at one transverse side. Such a plug-in card is manufactured without impairing the mechanical stability, in a simpler and more cost-effective manner with a reduced number of components and at the same time has adequate electromagnetic shielding. This is accomplished by provision for the housing (11) to have two housing parts (12, 13) constructed as half shells from thin sheet metal, one housing part (12, 13) being constructed for positive-locking reception for the printed circuit board or boards (16) fitted with at least one edge connector (17, 18), and the two housing parts (12, 13) constructed as half-shells being provided with longitudinal side walls (27, 28; 47, 48) formed in such a way that the longitudinal side walls (47, 48) of one of the housing parts (13, 12) grip the longitudinal side walls (27, 28) of one of the other housing parts (12, 13) in a locking manner.

5 Claims, 5 Drawing Sheets

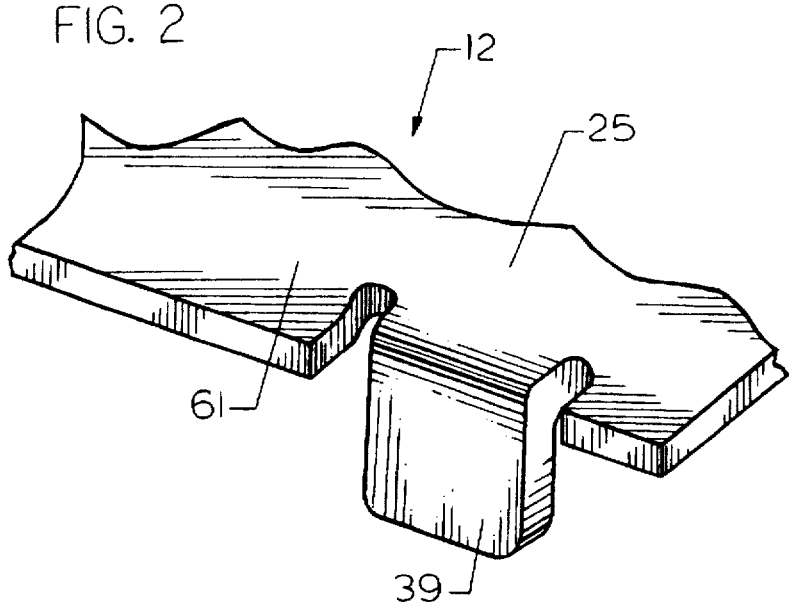
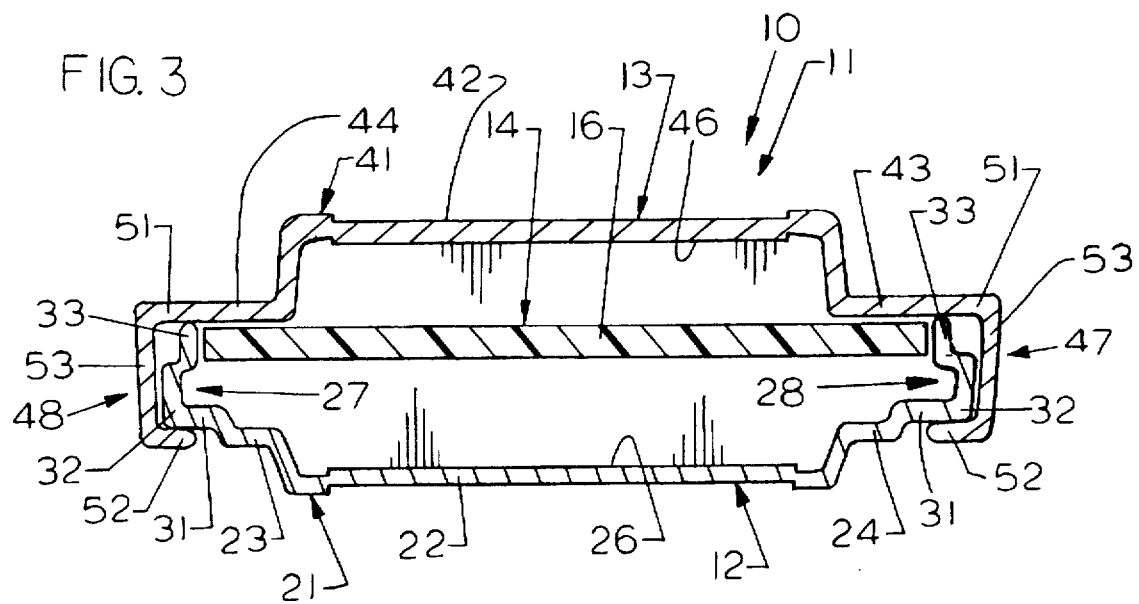

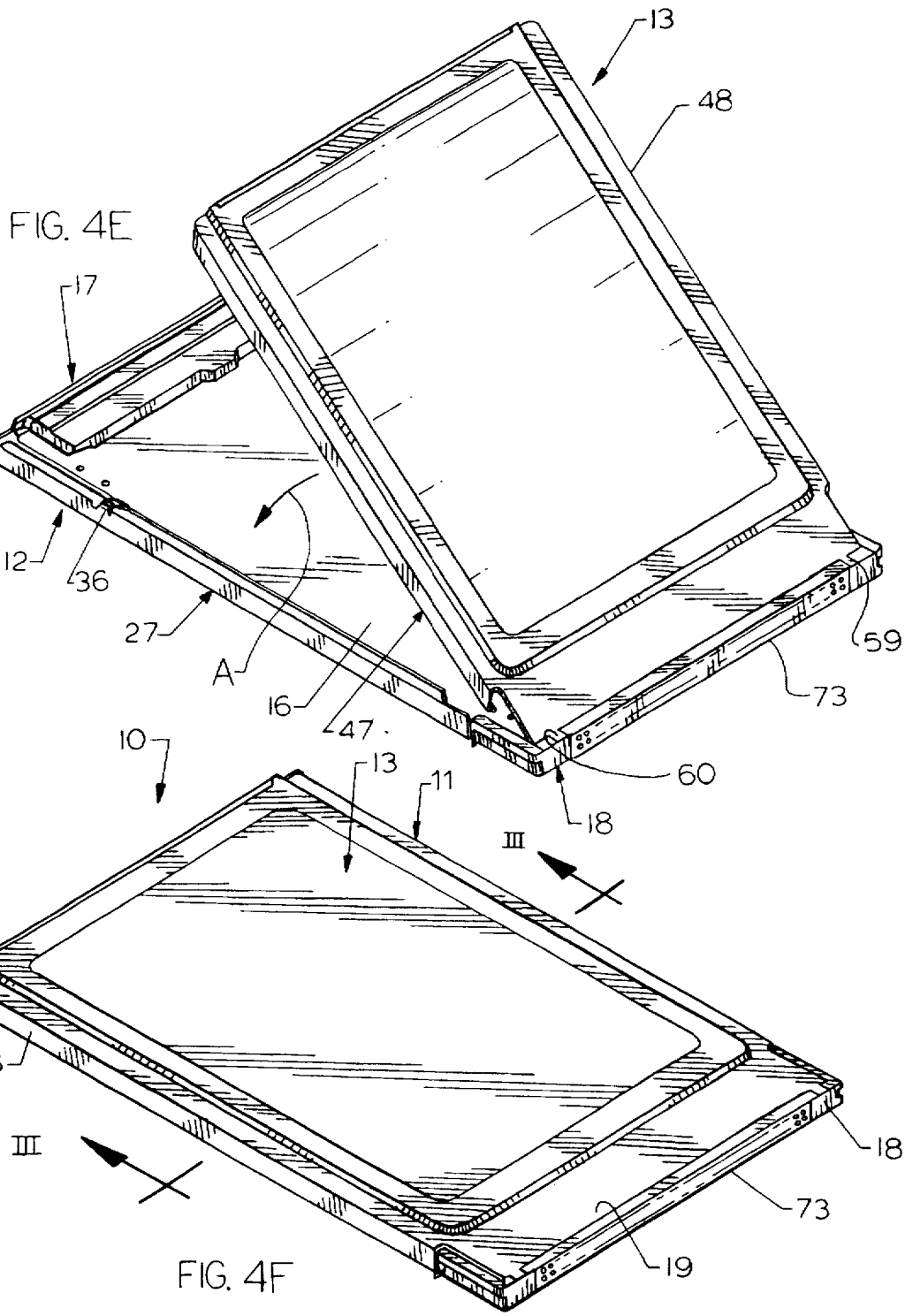

PLUG-IN CARD FOR ELECTRONIC DATA PROCESSING EQUIPMENT AND A PROCESS FOR ITS MANUFACTURE AND ASSEMBLY

BACKGROUND OF THE INVENTION:

The present invention relates to a plug-in card for electronic data processing equipment, and to a process for the manufacture and assembly of such a plug-in card.

Known plug-in cards, such as those offered as memory boards, modem cards, fax cards and the like in the PCMCIA standard, have a plastic frame to which one or two end connectors are attached and in which the printed circuit board fitted with electronic components is arranged and retained. metal covers are placed on either side of this plastic frame equipped in this way so that the printed circuit board and its components cannot be damaged by external mechanical effects. Since the plastic frame, which is difficult to manufacture and process, offers only limited stability, the metal cover must be expensively glued or welded so that the plug-in card assembled in this way is flexurally strong and torsionally rigid. In order to reduce the number of necessary components, attempts have already been made to integrate the end connectors into the frame, but this has made the assembly of the contacts difficult. A further problem with this known plug-in card is that there is no shielding against external electromagnetic influences in the region of the outer edges of the frame, in particular the longitudinal edges of the frame.

The object of the present invention is therefore to create a plug-in card of the type referred to above which, without impairing mechanical stability, can be manufactured in a simpler and more cost-effective manner with a reduced number of components and at the same time has adequate electromagnetic shielding. Moreover, a rapid and simple process for the manufacture and assembly of such a plug-in card is described.

SUMMARY OF THE INVENTION:

According to the invention, a plug-in card is provided which does not have a frame component, so the number of components is less and the card is less expensive. Furthermore, the connection between end connector and frame is eliminated, and the connection between end connector and printed circuit board remains. Mechanical torsional stiffness or stability, is attained by locking the housing parts together, thereby eliminating expensive gluing or welding. This type of assembly for the two housing parts can be effected in a very simple and rapid manner. Moreover, improved electromagnetic shielding is achieved since the housing parts overlap each other at least along the longitudinal sides of the plug-in card. A further advantage is that the printed circuit board inside the plug-in card can be enlarged by the space otherwise required for the frame.

The process according to the invention results in a simple and rapid assembly of the plug-in cards due to the reduced number of components. As before, the end connectors can be produced separately and therefore in a simple way. The simply assembled constructional unit comprising printed circuit board and one or two end connectors, can be first secured in a definite and uncomplicated manner in a first housing part. Then, the other housing part can be mounted without the need to provide special measures for the retention of printed circuit boards and end connectors in the one housing part. This results in a considerable cost reduction.

For the mounting of both housing parts, local pre-attachment of one housing part to the other via one of the end connectors can be achieved by means of a swinging movement. If required, machine-controlled mounting of the two housing parts can be provided. At the start of the swinging movement, the movement guides the two housing parts together, which increases the speed and reliability of the locking action.

A further increase in the torsional rigidity and the stability in relation to the flatness is obtained by bending to absorb material stresses which result from folded edges.

Electrical discharges and overvoltage is prevented. This is achieved much more simply without a frame by merely laying a housing part and printed circuit board on top of each other.

Further particulars of the invention are given in the following description in which the invention is described in more detail and explained wit the aid of the exemplary embodiment illustrated in the drawing.

DESCRIPTION OF THE DRAWINGS

FIG. 2 is a partial, isometric view, rotated view of a detail shown in the circle 11 in FIG. 1A.

FIG. 3 is a sectional view taken on line III—III of FIG. 4F.

FIG. 4A to 4F are isometric views showing a step-by step assembly of the plug-in card from its individual components.

DETAILED DESCRIPTION OF THE INVENTION

Figure 1A:
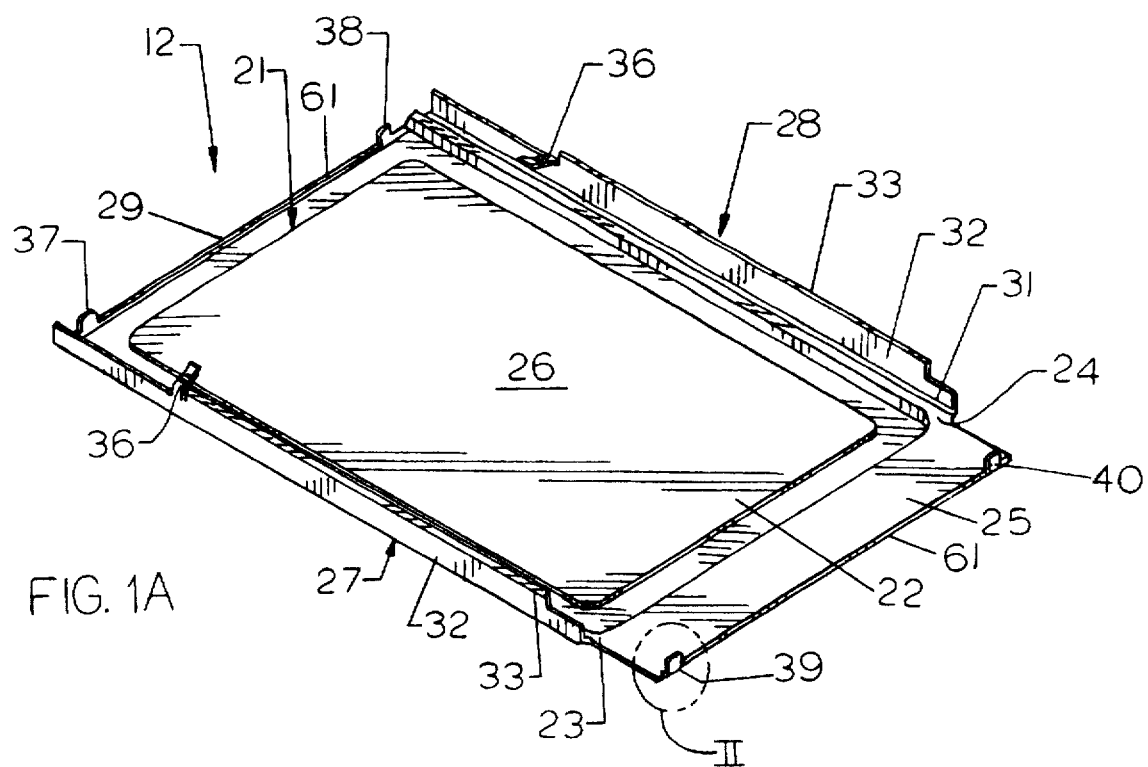
FIG. 1A is an isometric view of a lower housing part of a plug-in card of the present invention.

The frameless IC (integrated circuit) card, or plug-in card 10 (FIG. 3) for electronic data processing equipment, illustrated in the assembled state in FIGS. 3 and 4F, has a longitudinal, rectangular and very flat housing 11 that is assembled from a lower housing part 12 and an upper housing part 13 connected to it in a locking manner. A circuit board unit 14 has a printed circuit board 16 fitted with electronic components (not shown) and two end, or edge connectors 17 and 18 (FIG. 4E). Each end connector lies at one transverse end of the printed circuit board 16 and is connected to it. Each end connector is arranged and attached between the two housing parts 12 and 13 (FIG. 3). The two end connectors 17 and 18 at the transverse ends of the plug-in card 10 are externally accessible, as at the end 19 (FIG. 4F) of the plug-in card 10.

Both housing parts 12 and 13 (FIG. 3) are stamped out from thin sheet metal and formed into half shells. the lower housing part 12 has a base 21 which, over a wide central region 22, is formed so that it bulges towards the inner side 26 by less than the thickness of the sheet. The lower housing part 12 has longitudinal edge regions 23, 24 and one of its end regions 25 (FIG. 1A) is stamped so that it protrudes over the inner side 26 by a multiple of the thickness of the sheet. An L-shaped longitudinal wall 27, 28 which extends from one end 29 of the base 21 to the start of the end region 25, adjoins both longitudinal edge regions 23, 24. As shown in FIG. 3, the horizontal longitudinal flange 31 of the longitudinal walls 27, 28 is bent further away from the inner side 26 by approximately the thickness of the sheet, while the approximately vertical or slightly inwardly inclined flange 32 of the two longitudinal walls 27, 28 is bent inward at its free end region towards the opposite longitudinal wall by no more than the thickness of the sheet. A guide edge region 33 is thus produced at the free end of the longitudinal walls 27, 28, which extends only over a partial longitudinal region of the longitudinal walls 27, 28. Close to the end 29 (FIG. 1A) of the base 21, an earthing or grounding tab 36 is notched out of the flange 32 of the longitudinal walls 27, 18. The tab 36 is bent towards the inner side of the lower housing part 12. The end 29 has largely vertical retaining tabs 37, 38 turned towards the respective longitudinal walls 27, 28. The longitudinal walls are narrow compared to the width of the lower housing part 12, and the walls are bent perpendicularly upwards from the base 21 and end in front of the free ends of the longitudinal walls 27, 28. Corresponding retaining tabs 39 and 40 are likewise bent perpendicularly upwards from the end region 25 of the base 21 in the direction of the longitudinal walls 27, 28. These retaining tabs 39, 40 are also arranged at the side near the two longitudinal walls 27, 28 and likewise extend up to the level of the bend of the two flanges 32 of the longitudinal walls 27, 28.

Figure 1B:
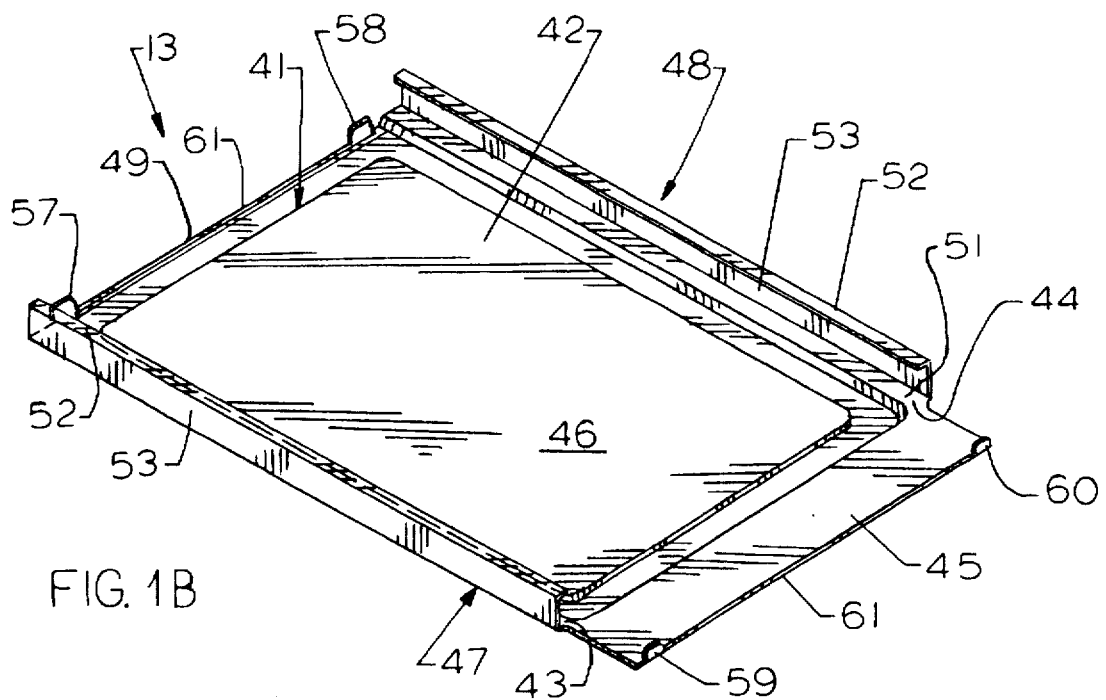
FIG. 1B is an isometric view of an upper housing part of the plug-in card.

The upper housing part 13 (FIG. 1B) is constructed in a similar way to the lower housing part 12. The upper housing part 13 likewise has a flat base 41, whose large central region 42 is prestamped towards the inner side 46 by less than the thickness of the sheet. The upper housing part has longitudinal sides that change to longitudinal edges 43, 44, and like an end region 45 are bent away from the inner side 46 by a multiple of the thickness of the sheet. U-shaped or trough-shaped longitudinal walls 47, 48 adjoin the longitudinal edges 43, 44. Both longitudinal walls 47, 48 extend from the one end 49 to the start of the end region 45. The inner flange 51 of the longitudinal walls 47, 48 lies in a plane with the longitudinal edge 43, 44. The outer flange 52 runs parallel to the inner flange 51 and the connecting flange 53 perpendicularly to it. Like the lower housing part 12, the upper housing part 13 has retaining tabs 57 to 60 at both its ends 49 and 45. However, the retaining tabs 57-60 lie lower than the retaining tabs 37 to 40 of the lower housing part 12. The retaining tabs 37 to 40 of the lower housing part 12 and the retaining tabs 57 to 60 of the upper housing part 13 lie opposite each other in the assembled state of the plug-in card 10. As a result, the sum of their lengths overlapping the respective inner side 26, 46 is at most equal to the respective clear inside width between the two housing parts 12 and 13 in the assembled state.

In a region between the tabs 37-40 of the lower housing part and of the tabs 57-60 of the upper housing part, each of the ends 25, 29 and 45, 49 is provided with a narrow, bent strip 61 increases the bent strip, which is shown in FIG. 2 as bent at an upward angle of a plurality of degrees, increases torsional stiffness of the respective housing part 12, 13.

As FIG. 3 shows, both housing parts 12 and 13 are connected together in a locking manner in the assembled state of the plug-in card 10. The two longitudinal walls 47 and 48 of the upper housing part 13 enclose the two longitudinal walls 27 and 28 of the lower housing part 12. The bottom or outer flanges 52 of the longitudinal walls 47, 48 of the upper housing part 13, are bent with respect to the longitudinal edge regions 23, 24, to grip the horizontal flanges 31 of the longitudinal walls 27, 28, of the lower housing part 12.

Figure 4A:
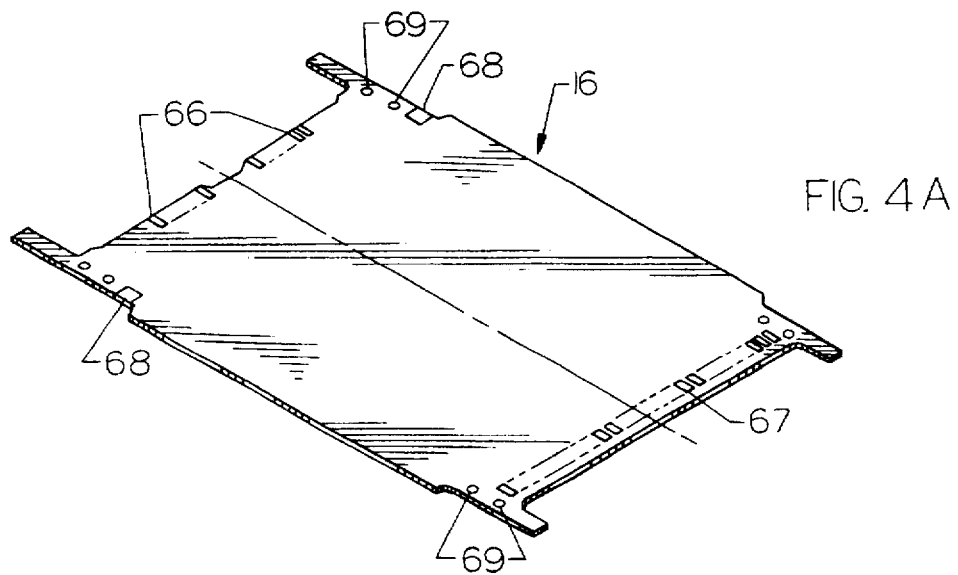
Figure 4B:
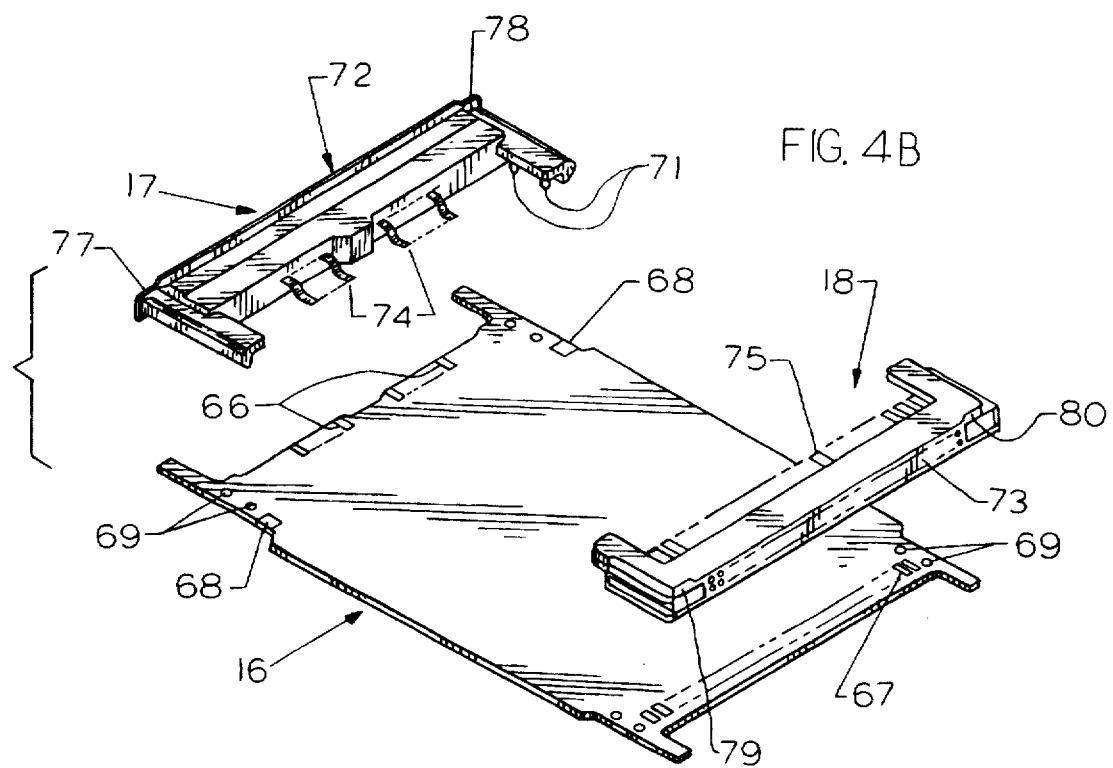
Figure 4C:
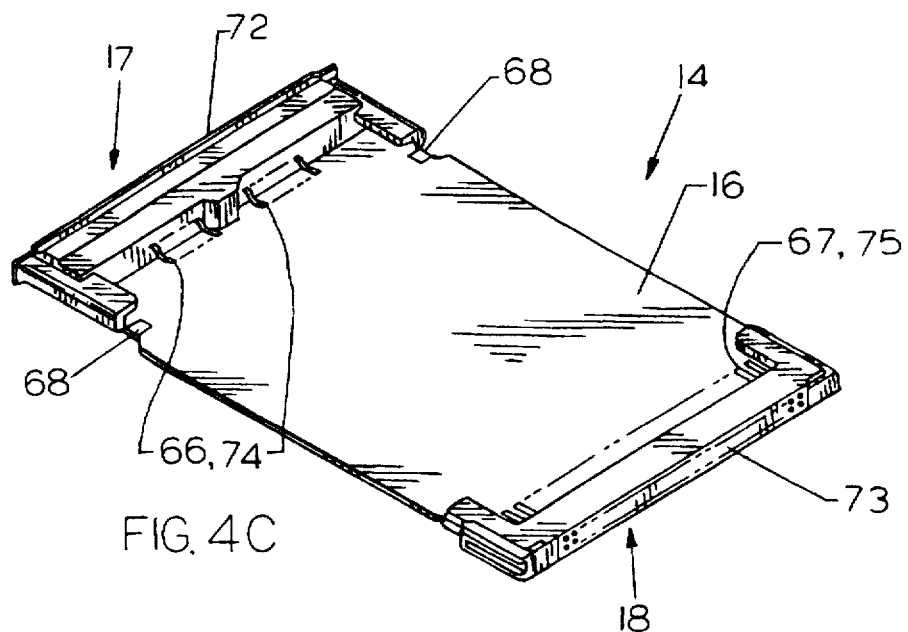
Figure 4D:
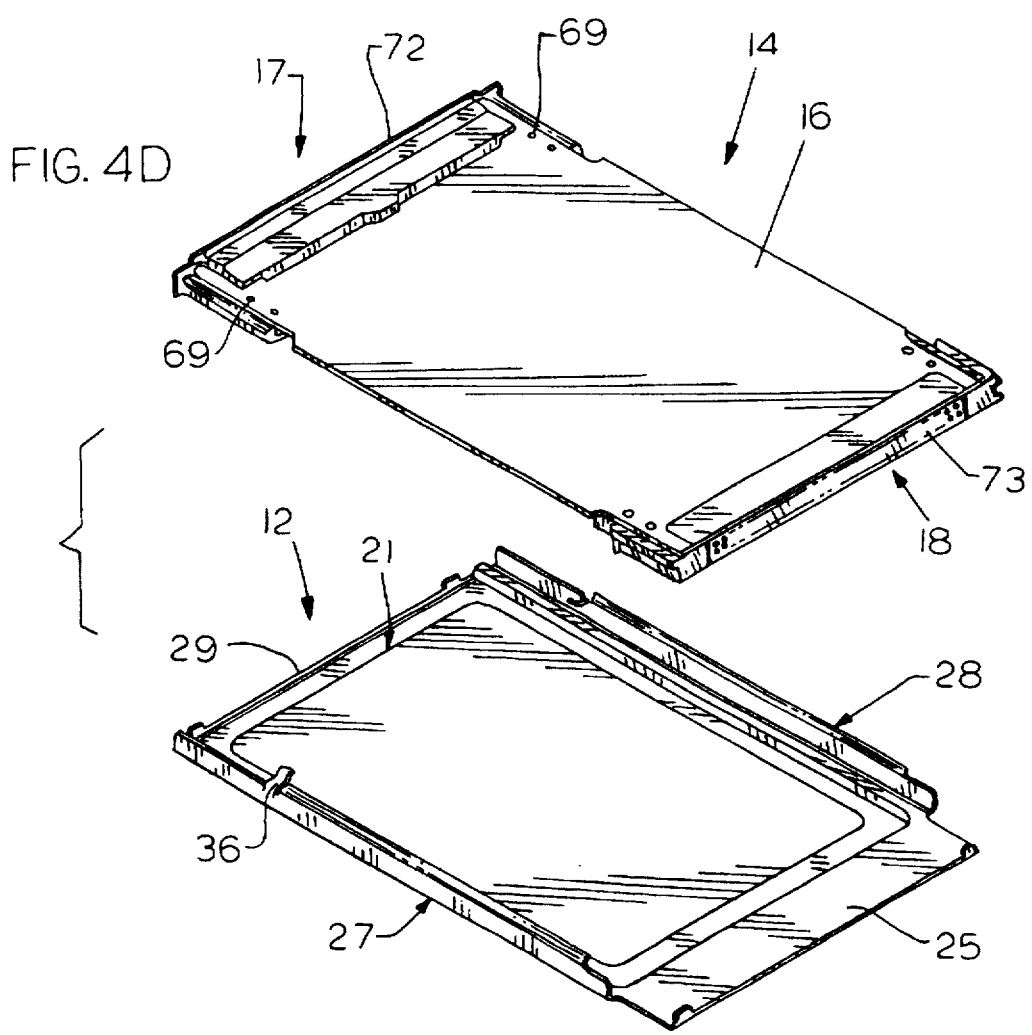

The manufacture and assembly of the plug-in card 10 is described with the aid of FIGS. 4A to 4F. FIG. 4A shows the printed circuit board 16, but for the sake of the simplicity the electronic components on one or both sides of the printed circuit board 16 are not illustrated. The printed conductors and the fixing holes for the components are also not shown. Only the contact arrangements 66 and 67 for the two edge connectors 17 and 18, and contact areas 68 for the two grounding tabs 36 are shown. Moreover, the printed circuit board 16 has receptacle holes 69 to receive pins 71 molded onto the edge connectors 17, 18, as shown in FIG. 4B. The edge connectors 17, 18 each have an insulated body of molded material that holds contacts 72, 73 with contact tails or terminal, lugs 74, 75. The edge connectors 17, 18 are placed at one end of the printed circuit board 16 in a manner illustrated in FIGS. 4B and 4C, and the terminal lugs 74, 75 are connected to the contacts 66, 67 by means of a soldering operation, for example. The unit 14 created from the printed circuit board 16 fitted with components, and the two edge connectors 17,18 is turned round as shown in FIG. 4D and placed into the lower housing part 12. Here, the retaining tabs 37 to 40 (FIG. 1A) of the lower housing part 12 are plugged into corresponding slots or recesses 77 to 80 (FIG. 4B), so that the unit 14 (FIG. 4D) is fixed in the longitudinal direction for the lower housing part 12. Slight locking for the side edges of the edge connectors 17,18 between the two longitudinal walls 27 and 28 is produced in the transverse direction for the lower housing part 12. In this inserted state, the two grounding tabs 36 make contact with the contact areas 68 of the printed circuit board 16.

As FIG. 4E shows, the upper housing part 13 is positioned with its retaining tabs 59, 60 inserted into the corresponding slots 79, 80 (FIG. 4B) of the edge connector 18. The upper housing part 13 (FIG. 4E) is inclined at a large angle to the lower housing part 12. In this arrangement the retaining tabs 59, 60 are slightly deformed elastically or plastically and bent outwards. This angular arrangement of the housing parts 12, 13 is such that the ends of the longitudinal walls 47, 48 facing the retaining tabs 59, 60, still do not contact the longitudinal walls 27, 28 of the lower housing part 12, as is clear from FIG. 4E Starting from this position for the upper housing part 13, which is fixed in the longitudinal direction for the plug-in card 10, the upper housing part 13 is swung towards the lower housing part 12 in the direction of the arrow A. The lower housing part (FIG. 3) has guide edge regions 33, and the upper housing part has outer flanges 52 that can, by slight outward deflection, slide over the longitudinal walls 27, 28. During such swinging, the longitudinal wall 27, 28 are progressively deflected. At the end of the swinging movement or downward pivoting of the upper housing part, the outer flanges 52 grip the horizontal flanges 31 in a locking manner. To further simplify and ensure this insertion step, it is possible, in a manner not illustrated in detail here, to slightly pre-stamp or bend the edge facing the end region 25 (FIG. 1A), of the guide edge region 33 (FIG. 3) of the flange 32 of the lower housing part 12, towards the inner side. FIG. 4F shows the final locked state in which the retaining tabs 57, 58 (FIG. 1B) have also reached the corresponding recesses 77, 78 (FIG. 4B) of the edge connector 17, 18. It is also clear from this that the end region 19 (FIG. 4F) fitted with the edge connector 18 is narrower than the remaining area of the plug-in card 10 and therefore can function as the plug end.

What is claimed is:

1. A plug-in card (10) having a housing (11), a printed circuit board (16) and at least a first end connector (17, 18), wherein:

said housing (11) has two housing parts (12, 13) that each forms a half-shell of sheet metal, with at least one of said housing parts and said first connector having means for engaging each other, and the two half-shell housing parts have longitudinal side walls (27, 28; 47, 48) with said side walls having means for gripping one another in a locking manner;

a first (12) of said housing parts has largely vertical retaining tabs (37 to 40), and said first connector has recess means (77 to 80) for receiving and pivoting on said tabs.

2. The plug-in card as claimed in claim 1 wherein:

said housing has opposite sides, with said side walls lying at said opposite housing sides:

said first housing part has a substantially flat end region (25), with a pair of said tabs at said end region each lying adjacent to a different one of said sides, and with said end region having an extreme end with a bend (61) that leaves an extreme end extending out of the plane of most of the rest of the end region with said bent extreme end extending sidewardly substantially all of the distance between said tabs.

3. A card comprising:

at least a first end connector;

a circuit board having a first end coupled to said first end connector;

upper and lower separate half shells that are each formed of sheet metal, with said lower shell having a primarily horizontally-extending region lying under said circuit board and having opposite shell sides, and having a pair of upstanding side walls extending up from said shell sides, and with said upper shell having a primarily horizontally-extending region lying over said circuit board and having a pair of downwardly extending side walls which lie slightly outward of said upstanding side walls so said upstanding side walls lie between said downwardly extending side walls;

said downwardly extending side walls each having bottom flanges (52) that extend inwardly to lie under a corresponding one of said shell sides of said lower shell, to lock said shells together;

said end connector has an upper surface with at least one slot therein and said upper shell has a first end with a depending tab thereat that lies in said slot, with said bottom flanges being of small enough inward extension that they can be resiliently deflected during downward pivoting of said upper shell while said at least one tab lies in said slot, and during which said flanges are outwardly deflected while said upstanding side walls are inwardly deflected until said flanges snap under said lower shell sides.

4. A process for the assembly of a plug-in card that includes a pair of separate housing parts that are each formed of sheet metal with horizontal central regions (22, 42) and vertical side walls, where said side walls form means for positively locking to each other, comprising:

providing a unit comprising a printed circuit board and at least one edge connector fixed thereto; and placing said unit into a first of said housing parts, and with the second housing part extending at an angle to the first housing part, pivoting the second housing part onto said first housing part and locking said housing parts together.

5. The process described in claim 4 wherein a first end of one of said housing parts has at least one tab, and a first end of the second of said housing parts has a slot that receives said tab, with said slot being wide enough to permit said tab to pivot by said angle while lying in said slot, with said angle being great enough to allow said unit to be placed into said first housing part when said second housing part is tilted by said large angle from a position parallel to and against said first housing part, and wherein:

said step of placing said unit includes inserting said tab into said slot, then placing said unit into said first housing part, and then pivoting said second housing part and allowing said housing parts to lock together.

* * * * *